US008530298B2

(12) United States Patent
Roybal et al.

(10) Patent No.: US 8,530,298 B2

(45) Date of Patent: Sep. 10, 2013

(54) RADIATION HARDENED INTEGRATED CIRCUIT

(75) Inventors: Richard G. Roybal, Arlington, TX (US); Shariq Arshad, Murphy, TX (US); Shaoping Tang, Allen, TX (US); James Fred Salzman, Anna, TX (US)

(73) Assignee: Texas Instruments Incorporated, Dallas, TX (US)

( * ) Notice: Subject to any disclaimer, the term of this patent is extended or adjusted under 35 U.S.C. 154(b) by 164 days.

(21) Appl. No.: 13/286,293

(22) Filed: Nov. 1, 2011

(65) Prior Publication Data

US 2013/0105904 A1 May 2, 2013

(51) Int. Cl.
*H01L 21/8238* (2006.01)
*H01L 21/70* (2006.01)

(52) U.S. Cl.
USPC .................. 438/202; 257/369; 257/E21.696; 438/203; 438/204; 438/208

(58) Field of Classification Search
None
See application file for complete search history.

(56) References Cited

U.S. PATENT DOCUMENTS

| | | | | |
|---|---|---|---|---|
| 5,156,989 | A * | 10/1992 | Williams et al. | 438/206 |
| 5,464,993 | A * | 11/1995 | Zambrano et al. | 257/140 |
| 5,652,456 | A * | 7/1997 | Lien | 257/370 |
| 7,304,354 | B2 | 12/2007 | Morris | |
| 2005/0045948 | A1* | 3/2005 | Springer | 257/342 |
| 2005/0179093 | A1* | 8/2005 | Morris | 257/371 |
| 2008/0061368 | A1* | 3/2008 | Williams et al. | 257/336 |

* cited by examiner

*Primary Examiner* — Julio J Maldonado
*Assistant Examiner* — Harpreet Singh
(74) *Attorney, Agent, or Firm* — Jacqueline J. Garner; Wade J. Brady, III; Frederick J. Telecky, Jr.

(57) ABSTRACT

A method of forming an integrated circuit (IC) includes providing a substrate having a topside semiconductor surface, wherein the topside semiconductor surface includes at least one of N+ buried layer regions and P+ buried layer regions. An epitaxial layer is grown on the topside semiconductor surface. Pwells are formed in the epitaxial layer. Nwells are formed in the epitaxial layer. NMOS devices are formed in and over the pwells, and PMOS devices are formed in and over the nwells.

15 Claims, 4 Drawing Sheets

RADIATION HARDENED INTEGRATED CIRCUIT

FIELD

Disclosed embodiments relate to radiation hardened integrated circuits (ICs) that include complementary metal-oxide-semiconductor (CMOS) devices.

BACKGROUND

Bulk CMOS technology is susceptible to being triggered into a latch-up (a high current state) condition due to the presence of parasitic bipolar transistor structures comprising a combination of NPN & PNP bipolar transistors that are coupled to form a parasitic PNPN structure. This parasitic PNPN structure is similar to a Silicon Controlled Rectifier (SCR) circuit.

When CMOS devices are exposed to high energy particles, such as heavy ions, protons, or neutrons, or light, CMOS devices are generally susceptible to adverse radiation effects such as Single Event Latch-up (SEL). There are various known ways to mitigate the SEL risk, including changing the IC layout using annular (race track) components, modifying the process, or using a select starting material such as an epi layer on a P+ substrate, or silicon on insulator or similar starting material that provides dielectric isolation between the devices.

Reducing the substrate resistance (Rsub) and Nwell resistance in a P-substrate starting material will produce lower voltage drops for the same current and thus mitigate the SCR, which minimizes the chance for latch-up of the SCR. Reducing the gain product (or β) of the NPN and PNP bipolar devices in the SCR feedback loop to less than one (1) can stop latch-up of the SCR. This can be accomplished by moving the Nwell and N+ Source/Drain spacing further apart, which increases the base width of the bipolar devices and thus reduces the bipolar gain. Guard rings are commonly used to reduce the parasitic impedance in the collector circuits of the parasitic SCR.

Another approach involves creating blanket buried guard rings or buried layers after transistor formation using high dose, very high energy implantation. This approach is low throughput due to a time consuming implant process, and results in a leakage path formed between the isolated wells and the substrate, such as between the Pwells and the p-substrate for a p− starting material. Moreover, this approach may increase gate dielectric integrity risks, and being a blanket doping process is only applicable to twin-well CMOS devices. Accordingly, none of these known approaches provide a cost-effective SEL solution that addresses existing bulk CMOS IC designs for twin-well CMOS devices, and none of these approaches are applicable to triple-well or vertical isolated CMOS devices.

SUMMARY

Disclosed embodiments include process integration and radiation hardened ICs therefrom that include buried layer arrangements and optional vertical sinkers, together with an epitaxial layer thereon, that provide immunity for radiation effects including SEL. Significantly, disclosed embodiments avoid the need for circuit redesign, high energy implants, and specialized substrates. Disclosed embodiments can be applied to both bulk CMOS technology and BiCMOS front-end manufacturing. Generally, back-end-of-line (BEOL) processing can remain the same.

Disclosed embodiments can be applied to both twin-well and triple-well CMOS devices. Triple-well devices are design instances that utilize buried layers and vertical sinkers for full junction isolation. For example, isolated NMOS, isolated PMOS, and isolated diodes can be triple-well structures in DeepNWell (in a P-type substrate). These triple-well design instances are commonly used in complex IC designs, such as digital signal processors (DSP's), data converters, and Open Multimedia Application processors (OMAPs). The component level buried layers are used for lateral and vertical isolation to nearby circuitry.

DETAILED DESCRIPTION

Figures 1A, 1B:
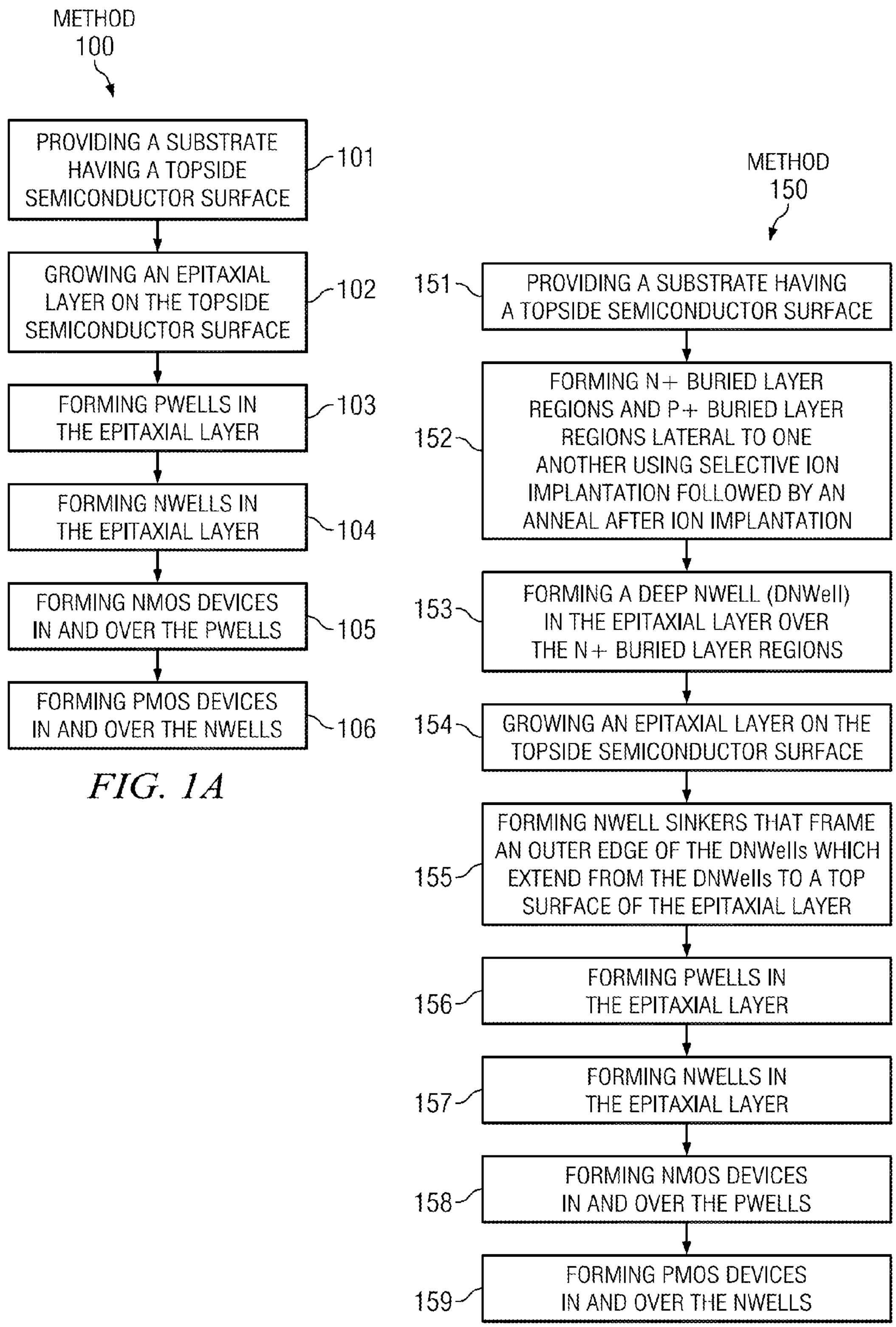
FIG. 1A is a flow chart that shows steps in an example method for forming radiation hardened ICs that include CMOS devices including bulk CMOS twin-well MOS transistors with a P+ buried layer, according to an example embodiment.
FIG. 1B is a flow chart that shows steps in another example method for forming radiation hardened ICs that include CMOS devices including bulk CMOS triple-well MOS transistors with an N+ buried layer, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

FIG. 1A is a flow chart that shows steps in an example method 100 for forming radiation hardened ICs that include CMOS devices, according to an example embodiment. Step 101 comprises providing a substrate having a topside semiconductor surface. The substrate is generally a bulk substrate, such as a silicon, silicon/germanium, or a gallium arsenide substrate, but can include generally any bulk substrate material. The topside semiconductor surface includes at least one of N+ buried layer regions and P+ buried layer regions. In one embodiment, a P+ substrate or an N+ substrate is provided to provide a blanket (continuous) buried layer.

In another embodiment the N+ buried layer regions and/or P+ buried layer regions are formed using a process comprising ion implantation followed by an anneal after ion implantation to anneal out implant damage. For the N+ buried layer regions in one embodiment the dopant can comprise In one embodiment Antimony is used for the N+ buried layer in a dose range from $1\times10^{15}$ cm$^{-2}$ to $3\times10^{15}$ cm$^{-2}$ at an energy from 30 to 80 keV, such as $2\times10^{15}$ cm$^{-2}$ at 60 keV in one particular embodiment. For the P+ buried layer regions in one embodiment the dopant comprises boron in a dose range from $7\times10^{14}$ cm$^{-2}$ to $2\times10^{15}$ cm$^{-2}$ at an energy from 20 to 60 keV, such as $1\times10^{15}$ cm$^{-2}$ at 40 keV in one particular embodiment. The anneal and drive following the buried layer implant(s) can comprise a furnace anneal for 60 to 120 minutes at a temperature from 1025° C. to 1150° C., such as for 80 min at 1100° C. in one particular embodiment.

For ICs having only twin-well CMOS devices for p-type starting material, the ion implantation can comprise blanket P+ ion implantation to form a substantially continuous P+ buried layer region under the IC. Having a P+ buried layer below each twin-well CMOS device and standard baseline components (i.e. resistors, diodes, etc.) reduces the parasitic impedance of the NPN substrate resistor $R_{sub}$ in the parasitic SCR circuit, which helps prevent SEL in the event of a high energy, charged particle strike or electromagnetic energy. For ICs having only twin-well devices, if the starting material is N-type, then the buried layer ion implantation can comprise blanket N+ ion implantation to form a substantially continuous N+ buried layer region under the IC.

Step 102 comprises growing an epitaxial layer on the topside semiconductor surface. The thickness of the epitaxial layer can generally be from 1 μm to 5 μm, such as in a range from 2 μm to 4 ∞m.

Step 103 comprises forming pwells in the epitaxial layer. For example, selective ion implantation (e.g., $B^{11}$, using a mask pattern) can be used to form the pwells. Step 104 comprises forming nwells in the epitaxial layer. For example, selective ion implantation (e.g., phosphorous or arsenic implant using a mask pattern) can be used to form the nwells.

Step 105 comprises forming NMOS devices in and over the pwells (the gate structure over the pwell). Step 106 comprises forming PMOS devices in and over the nwells (the gate structure over the nwell).

Optionally, in embodiments where the topside semiconductor surface includes both N+ buried layer regions and P+ buried layer regions positioned lateral to one another, over the P+ buried layer regions a first portion of pwells can provide twin-well instances of NMOS devices and a first portion of nwells provide twin-well instances of PMOS devices, the method can further comprise forming triple-well CMOS devices. Triple-well transistors are more robust compared to twin-well transistors by virtue of enhanced isolation. A deep nwell (DNWell) is formed in the epitaxial layer over the N+ buried layer regions. The DNWell implant in one embodiment can comprise phosphorous in a dose range from $1\times10^{12}$ cm$^{-2}$ to $3\times10^{12}$ cm$^{-2}$ at an energy from 1,000 keV (1 MeV) to 2,000 (2 MeV), such as a phosphorus dose of 1.75x1012 cm$^{-2}$ at 1,500 KeV (1.5 MeV) followed by a damage reducing rapid thermal anneal (RTA), such as at a temperature of 1050° C. for 30 sec.

Nwell sinkers can be formed after epitaxial growth that frame an outer edge of DNWells which extend from the DNWells to a top surface of the epitaxial layer. For the Nwell sinker, in one embodiment the implant can comprise a series of phosphorous implants that can also provide the threshold adjustment for the PMOS devices (VTP implant) comprising phosphorus at $2\times10^{12}$ cm$^{-2}$ to $6\times10^{12}$ cm$^{-2}$ at 120 keV to 180 keV; $4\times10^{12}$ cm$^{-2}$ at 250 keV to 400 keV; and $2\times10^{13}$ cm$^{-2}$ to $6\times10^{13}$ cm$^{-2}$ at 550 keV to 800 keV. In one particular embodiment the Nwell sinker implant comprises the following series of phosphorous implants, phosphorus $4\times10^{12}$ cm$^{-2}$ at 150 keV; $4\times10^{12}$ cm$^{-2}$ at 320 keV, and $4\times10^{13}$ cm$^{-2}$ at 675 keV followed by a damage reducing RTA. In this embodiment, over the DNWells a second portion of the pwells provide triple-well instances of NMOS devices and a second portion of the nwells provide triple-well instances of PMOS devices.

Method 100 can include continued processing per device baseline CMOS or BiCMOS routing to complete formation of NMOS and PMOS devices and optionally also bipolar devices. A back end of the line (BEOL) metal stack followed by passivation can then follow.

Numerous known process options may be included with method 100 and other disclosed embodiments including, but not limited to, trench isolation, replacement gate, spacers, halo implants, through-substrate-vias (e.g., through-silicon vias), and multi-level metallization. Moreover, as noted above, bipolar devices may also be formed to provide BiCMOS ICs.

FIG. 1B is a flow chart that shows steps in another example method 150 for forming radiation hardened ICs that include CMOS devices including bulk CMOS triple-well MOS devices with an N+ Buried Layer, according to an example embodiment. Step 151 comprises providing a substrate having a topside semiconductor surface. Step 152 comprises forming N+ buried layer regions and P+ buried layer regions lateral to one another using selective ion implantation followed by an anneal after ion implantation. Implant and anneal parameters can be based on those described above relative to step 101.

Step 153 comprises forming a deep nwell (DNWell) in the epitaxial layer over the N+ buried layer regions. Generally, dopant from the N+ buried layer, such as antimony, also covers the DNWell region to lower the resistance of the DNWell 311. Step 154 comprises growing an epitaxial layer on the topside semiconductor surface. Step 154 can be based on step 102 described above. Step 155 comprises forming Nwell sinkers that frame an outer edge of the DNWells which extend vertically from the DNWells to a top surface of the epitaxial layer.

Step 156 comprises forming pwells in the epitaxial layer. For example, selective ion implantation can be used to form the pwells. Step 157 comprises forming nwells in the epitaxial layer. For example, selective ion implantation (e.g., using a mask pattern) can be used to form the pwells and the nwells.

Step 158 comprises forming NMOS devices in and over the pwells (the gate over the pwell). Step 159 comprises forming PMOS devices in and over the nwells (the gate over the nwell). Over the P+ buried layer regions at this juncture a first portion of the pwells provide twin-well instances of NMOS devices and a first portion of nwells provide twin-well instances of PMOS devices, and over the DNWells a second portion of the pwells provide triple-well instances of the NMOS devices and a second portion of the nwells provide triple-well instances of PMOS devices.

Disclosed methods provide a low cost route for protecting IC's on bulk substrates against radiation effects including SEL for what would otherwise generally be radiation soft. The only additional processing with respect to conventional processing generally comprises an epitaxial layer process allowing for further front-end processing, and additional photo-mask alignment and buried layer(s) processing. No special (and generally more expensive) starting substrate material is needed.

Figure 2:
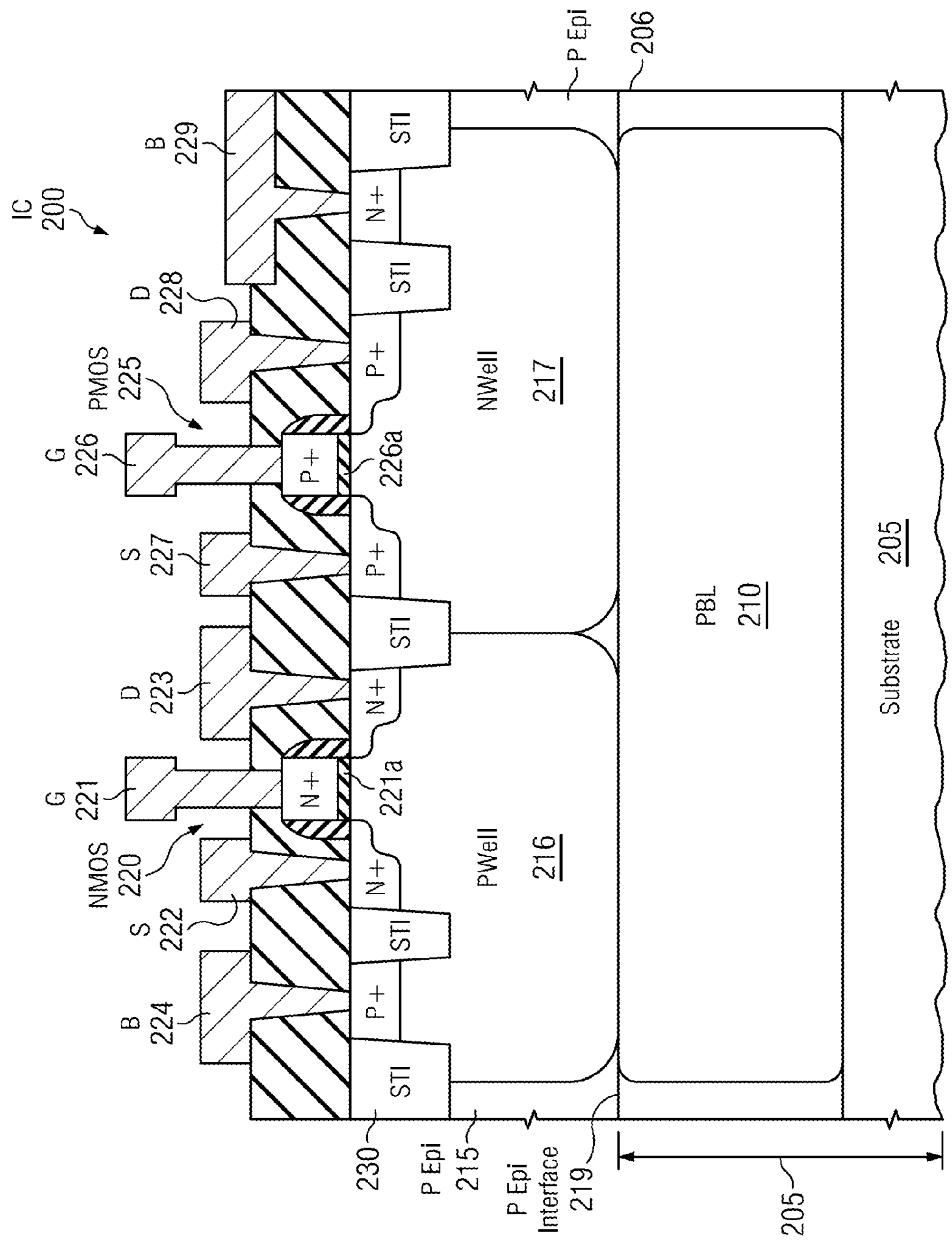
FIG. 2 is a cross sectional depiction of example IC showing bulk CMOS twin-well MOS devices with a P+ buried layer, according to an example embodiment.

FIG. 2 is a cross sectional depiction of example IC 200 showing bulk CMOS twin-well MOS devices with a P+ Buried Layer 210 (shown as PBL 210) formed in a topside surface 206 of a bulk substrate 205, according to an example embodiment. The various device terminals are shown as body (B), source (S), gate (G), and drain (D). The P+ buried layer 210 can be seen to be below each of the twin-well CMOS devices shown as twin-well NMOS 220 and twin-well PMOS 225, and is generally also provided under other standard baseline components as well (i.e. resistors, diodes, etc.). The P+ buried layer 210 reduces the parasitic impedance of the NPN substrate resistor $R_{sub}$ in the parasitic SCR circuit, which helps prevent SEL in the event of a high energy, charged particle strike. The P+ buried layer 210 is a blanket (un-patterned) layer that is suitable for IC designs that for the CMOS devices only have twin-well CMOS devices.

An epitaxial layer 215 is on the topside semiconductor surface 206 that forms an epi interface 219. A pwell 216 and an nwell 217 are formed in the epitaxial layer 215. A twin-well NMOS device 220 is in and over the pwell 216, and a twin-well PMOS device 225 is in and over the nwell 217. Trench isolation 230 is shown as shallow trench isolation (STI 230), including STI 230 between the pwell 216 and nwell 217 at the top surface of the epitaxial layer 215. NMOS device 220 is shown including G 221 (shown as an optional N+ doped polysilicon gate) and gate dielectric 221*a*, S 222, D 223, and B 224. PMOS device 225 is shown including G 226 (shown as an optional P+ doped polysilicon gate) and gate dielectric 226*a*, S 227, D 228, and B 229.

Figure 3:
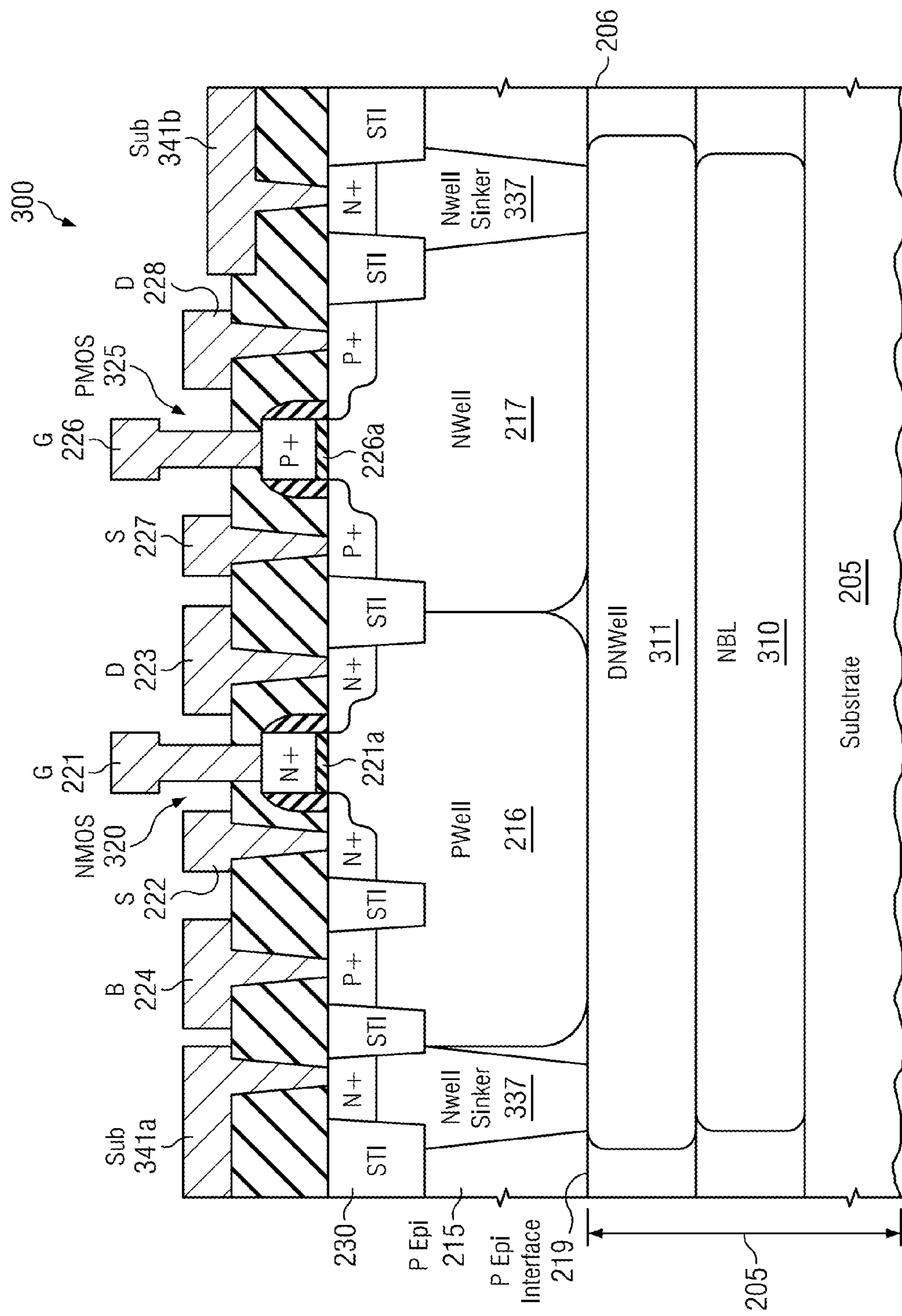
FIG. 3 is a cross sectional depiction of an example IC showing bulk CMOS triple-well MOS devices with an N+ buried layer, according to an example embodiment.

FIG. 3 is a cross sectional depiction of an example IC 300 showing bulk CMOS triple-well MOS devices with an N+ Buried Layer 310 (shown as NBL 310), according to an example embodiment. A deep nwell (DNWell) 311 is formed in the epitaxial layer 215 over the N+ buried layer 310, and Nwell sinkers 337 coupled to N+ contacts are provided which frame an outer edge of the DNWell 311 extending vertically from the DNWell 311 to a top surface of the epitaxial layer 215. Although not shown in FIG. 3 (and FIG. 4 described below), dopant from the N+ buried layer 310, such as antimony, also covers the region shown as DNWell 311 to lower the resistance of the DNWell 311.

Pwell 216 can be seen to be fully junction isolated (an isolated pwell). The N+ buried layer 310 can in one embodiment comprise antimony to limit diffusion. However, the dopant for the N+ buried layer 310 can also comprise arsenic, or phosphorous. The DNWell 311 can comprise phosphorous. However, DNWell 311 can also comprise arsenic or antimony.

Near the top surface of the epitaxial layer 215 triple-well NMOS device 320 is analogous to twin-well NMOS device 220 shown in FIG. 2 other than triple-well NMOS device 320 further comprising a substrate (Sub) contact 341*a* that connects to DNWell 311 through NWell sinker 327. Near the top surface of the epitaxial layer 215 triple-well PMOS device 325 is analogous to twin-well PMOS device 225 shown in FIG. 2 other than further comprising a substrate (Sub) contact 341*b* that connects to DNWell 311 through NWell sinker 327.

Figure 4:
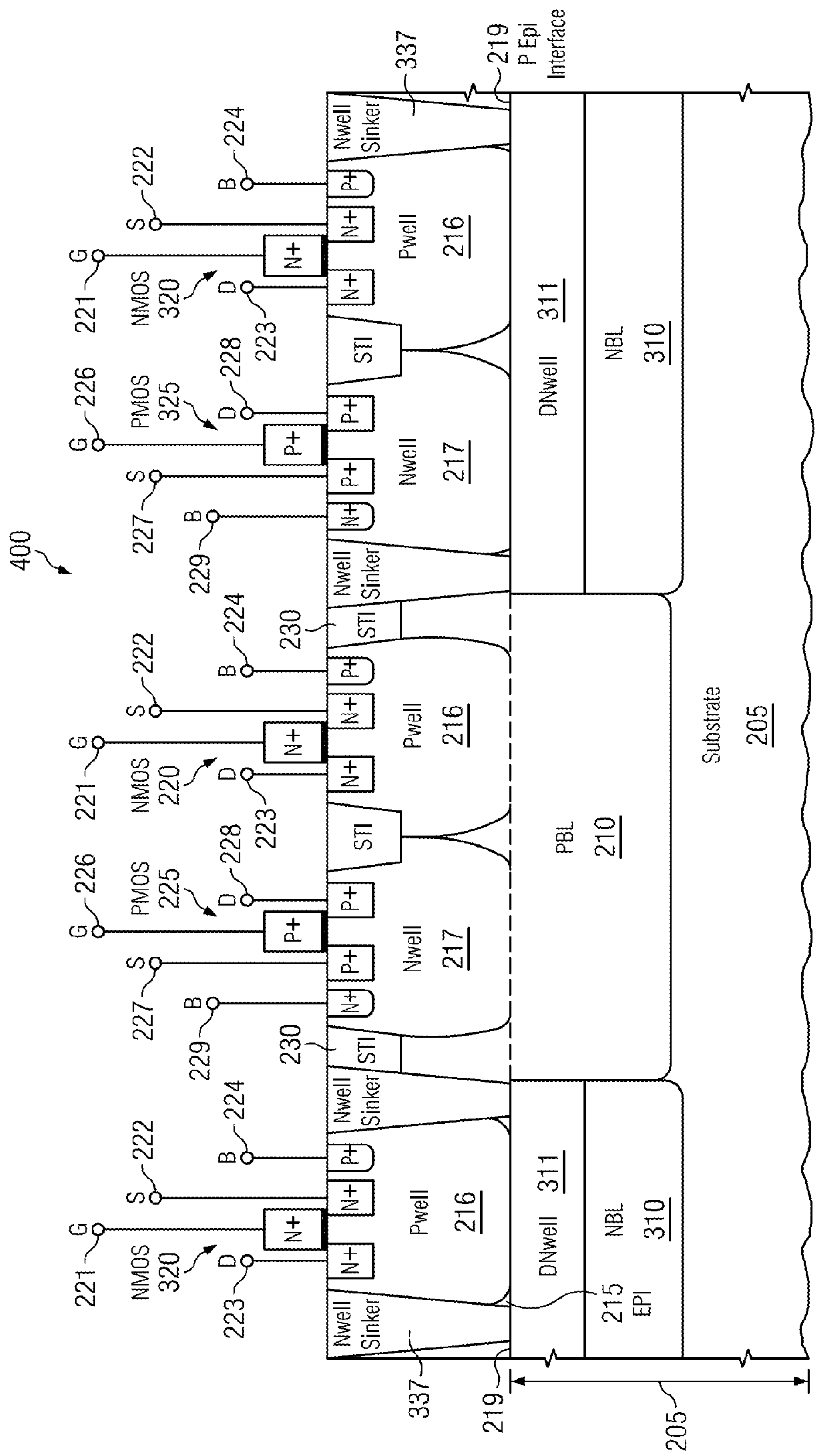
FIG. 4 is a cross sectional depiction of an example IC showing bulk CMOS twin-well MOS devices with a P+ buried layer and bulk CMOS triple-well MOS devices with an N+ buried layer, according to an example embodiment.

FIG. 4 is a cross sectional depiction of an example IC 400 showing a CMOS twin-well NMOS device 220 and twin-well PMOS device 225 with a P+ Buried Layer 210, together with a triple-well NMOS device 320 and a triple-well PMOS device 325 with an N+ Buried Layer 310 and DNWell 311, according to an example embodiment. IC 400 thus includes a patterned P+ buried layer 210 and patterned N+ buried layer 310. As described above, patterned P+ buried layer 210 and patterned N+ buried layer 310 can be formed by conventional patterning and high dose ion implantation. The N+ buried layer 310 below DNwell 311 included with triple-well PMOS device 325 and NMOS device 320 provides added robustness.

Disclosed embodiments are well suited a variety of space, military, medical and commercial IC applications on bulk CMOS and BiCMOS technology. Aside from being the only known SEL solution for existing designs, disclosed embodiments offer advantages including a minimal invasive SEL solution compatible with current fab tooling (i.e. lithography, ion implant, etc.) and process recipes. No special equipment is generally needed, nor are non-standard recipes, or is special starting material needed. Moreover, radiation testing has confirmed disclosed ICs meet SEL targets in harsh radiation environments (tested at >64 MeV at room temperature), resulting in zero or minimal test yield impact when compared to control ICs. Disclosed embodiments thus provide low cost radiation hardening for existing IC designs, and avoid the need for IC redesign (re-layout).

The active circuitry formed on the semiconductor substrate comprises circuit elements that may generally include transistors, diodes, capacitors, and resistors, as well as signal lines and other electrical conductors that interconnect the various circuit elements. Disclosed embodiments can be integrated into a variety of process flows to form a variety of devices and related products. The semiconductor substrates may include various elements therein and/or layers thereon. These can include barrier layers, other dielectric layers, device structures, active elements and passive elements, including source regions, drain regions, bit lines, bases, emitters, collectors, conductive lines, conductive vias, etc. Moreover, disclosed embodiments can be used in a variety of semiconductor device fabrication processes including bipolar, CMOS, BiCMOS and MEMS processes.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

We claim:

1. A method of forming an integrated circuit (IC), comprising:

providing a substrate having a topside semiconductor surface, wherein said topside semiconductor surface includes both N+ buried layer regions and P+ buried layer regions positioned lateral to one another;

growing an epitaxial layer on said topside semiconductor surface;

forming pwells in said epitaxial layer;

forming nwells in said epitaxial layer;

forming NMOS devices in and over said pwells, forming PMOS devices in and over said nwells;

wherein over said P+ buried layer regions a first portion of said pwells provide twin-well instances of said NMOS devices and a first portion of said nwells provide twin-well instances of said PMOS devices, further comprising forming a deep nwell (DNWell) in said epitaxial layer over said N+ buried layer regions, and forming Nwell sinkers that frame an outer edge of said DNWells which extend vertically from said DNWells to a top surface of said epitaxial layer, wherein over said DNWells a second portion of said pwells provide triple-well instances of said NMOS devices and a second portion of said nwells provide triple-well instances of said PMOS devices.

2. The method of claim 1, further comprising forming said N+ buried layer regions or forming said P+ buried layer regions using ion implantation followed by an anneal after said ion implantation.

3. The method of claim 2, wherein said ion implantation comprises blanket P+ ion implantation to form said P+ buried layer regions.

4. The method of claim 1, further comprising forming said N+ buried layer regions and forming said P+ buried layer regions using ion implantations followed by an anneal after said ion implantations.

5. The method of claim 1, wherein a thickness of said epitaxial layer is from 1 μm to 5 μm thick.

6. The method of claim 1, further comprising printing a first pattern to provide masking and then performing selective ion implantation to form said N+ buried layer regions, and printing a second pattern to provide masking and then performing selective ion implantation to form said P+ buried layer regions.

7. The method of claim 1, wherein said substrate comprises a bulk silicon comprising substrate.

8. A method of forming an integrated circuit (IC), comprising:

providing a substrate having a topside semiconductor surface, forming N+ buried layer regions and P+ buried layer regions lateral to one another using selective ion implantation followed by an anneal after said selective ion implantation;

forming a deep nwell (DNWell) in said epitaxial layer over said N+ buried layer regions;

growing an epitaxial layer on said topside semiconductor surface;

forming Nwell sinkers that frame an outer edge of said DNWells which extend vertically from said DNWells to a top surface of said epitaxial layer;

forming pwells in said epitaxial layer;

forming nwells in said epitaxial layer;

forming NMOS devices in and over said pwells, and forming PMOS devices in and over said nwells, wherein over said P+ buried layer regions a first portion of said pwells provide twin-well instances of said NMOS devices and a first portion of said nwells provide twin-well instances of said PMOS devices, and wherein over said DNWells a second portion of said pwells provide triple-well instances of said NMOS devices and a second portion of said nwells provide triple-well instances of said PMOS devices.

9. The method of claim 8, further comprising printing a first pattern to provide masking and then performing selective ion implantation to form said N+ buried layer regions, and using a second pattern to provide masking and then performing selective ion implantation to form said P+ buried layer regions.

10. An integrated circuit (IC) including complementary metal-oxide-semiconductor (CMOS) devices, comprising:

a bulk substrate having a topside semiconductor surface, wherein said topside semiconductor surface includes N+ buried layer regions and P+ buried layer regions lateral to one another;

an epitaxial layer on said topside semiconductor surface, a deep nwell (DNWell) in said epitaxial layer over said N+ buried layer regions;

Nwell sinkers which frame an outer edge of said DNWells extending vertically from said DNWells to a top surface of said epitaxial layer;

pwells in said epitaxial layer;

nwells in said epitaxial layer;

NMOS devices in and over said pwells, and

PMOS devices in and over said nwells, wherein over said P+ buried layer regions a first portion of said pwells provide twin-well instances of said NMOS devices and a first portion of said nwells provide twin-well instances of said PMOS devices, and wherein over said DNWells a second portion of said pwells provide triple-well instances of said NMOS devices and a second portion of said nwells provide triple-well instances of said PMOS devices.

11. The IC of claim 10, wherein said substrate comprises a bulk silicon comprising substrate.

12. The IC of claim 10, wherein a thickness of said epitaxial layer is from 1 μm to 5 μm.

13. The IC of claim 10, wherein said N+ buried layer regions comprise antimony (Sb).

14. The IC of claim 10, wherein said DNWells comprise phosphorous.

15. The IC of claim 10, further comprising trench isolation regions positioned to provide dielectric isolation including at a top surface of said epitaxial layer between said pwells and said nwells.

* * * * *